United States Patent
Takada

(10) Patent No.: US 9,429,850 B2
(45) Date of Patent: Aug. 30, 2016

(54) LASER DEVICE, AND EXPOSURE DEVICE AND INSPECTION DEVICE PROVIDED WITH LASER DEVICE

(71) Applicant: NIKON CORPORATION, Tokyo (JP)

(72) Inventor: Yasutoshi Takada, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/381,245

(22) PCT Filed: Mar. 5, 2013

(86) PCT No.: PCT/JP2013/056010
§ 371 (c)(1),
(2) Date: Dec. 16, 2014

(87) PCT Pub. No.: WO2013/133278
PCT Pub. Date: Sep. 12, 2013

(65) Prior Publication Data
US 2015/0131068 A1   May 14, 2015

(30) Foreign Application Priority Data

Mar. 5, 2012   (JP) .................................. 2012-048211

(51) Int. Cl.
*G03B 27/54*   (2006.01)
*G03B 27/74*   (2006.01)
(Continued)

(52) U.S. Cl.
CPC ......... *G03F 7/70191* (2013.01); *G02F 1/3544* (2013.01); *G03F 7/70025* (2013.01);
(Continued)

(58) Field of Classification Search
CPC .................................................. G03F 7/70191

USPC ........................... 355/67–71; 372/20, 29.015
See application file for complete search history.

(56) References Cited

U.S. PATENT DOCUMENTS

| 6,590,698 B1 * | 7/2003 | Ohtsuki ................... G02B 6/14 |
| | | 359/326 |
| 2010/0110533 A1 | 5/2010 | Kusukame et al. |

(Continued)

FOREIGN PATENT DOCUMENTS

| JP | A-10-153806 | 6/1998 |
| JP | A-2002-90787 | 3/2002 |

(Continued)

OTHER PUBLICATIONS

Jun. 11, 2013 International Search Report issued in International Application No. PCT/JP2013/056010 (with translation).

*Primary Examiner* — Hung Henry Nguyen
(74) *Attorney, Agent, or Firm* — Oliff PLC

(57) ABSTRACT

A laser device includes: a laser light output unit that outputs a fundamental wave laser light; a wavelength conversion unit that performs wavelength conversion of the fundamental wave laser light and outputs a converted laser light; an output detector that detects a power of the converted laser light; a power feedback circuit that controls the power of the fundamental wave laser light such that the power of the converted laser light is in constant; a phase matching adjustment configuration that adjusts a quantity of state at the wavelength conversion optical element; and a phase matching control circuit that controls an operation the phase matching adjustment configuration, wherein in a state that the power of the converted laser light is controlled in constant, the phase matching control circuit adjust the quantity of state in a predetermined range such that the power of the fundamental wave laser light is minimized.

16 Claims, 8 Drawing Sheets

(51) Int. Cl.
*G03F 7/20* (2006.01)
*H01S 3/067* (2006.01)
*G02F 1/35* (2006.01)
*H01S 3/16* (2006.01)
*H01S 3/00* (2006.01)

(52) U.S. Cl.
CPC ... *H01S3/06758* (2013.01); *G02F 2001/3505* (2013.01); *G02F 2001/3507* (2013.01); *G02F 2001/3546* (2013.01); *H01S 3/0085* (2013.01); *H01S 3/0092* (2013.01); *H01S 3/1618* (2013.01)

(56) References Cited

U.S. PATENT DOCUMENTS

2010/0303107 A1* 12/2010 Bhatia .................. H01S 5/0683
                                                              372/20
2011/0096390 A1*  4/2011 Hempstead ............ G02B 27/48
                                                              359/326
2013/0064256 A1*  3/2013 Xu ...................... H01S 3/06712
                                                              372/27

FOREIGN PATENT DOCUMENTS

| JP | A-2004-86193 | 3/2004 |
| JP | A-2008-122785 | 5/2008 |
| JP | A-2010-256784 | 11/2010 |
| WO | WO 2009/081577 A1 | 7/2009 |

* cited by examiner

LASER DEVICE, AND EXPOSURE DEVICE AND INSPECTION DEVICE PROVIDED WITH LASER DEVICE

TECHNICAL FIELD

The present invention relates to a laser device including a laser light output unit that outputs fundamental wave laser light, and a wavelength conversion unit provided with a wavelength conversion optical element that performs wavelength conversion of fundamental wave laser light output from the laser light output unit so as to output wavelength-converted laser light. Also, the present invention relates to a laser system including such a laser device, examples of which include an exposure device, an inspection device, and the like.

BACKGROUND ART

Such a laser device as described above is employed as a light source of a laser system such as a microscopes, profile measurement device, exposure device, inspection device, etc. The wavelength of output lights from laser devices are designed according to the usage and the functions of the laser system mounting such laser devices. Specifically, a combination of the wavelength of the fundamental wave laser light output from the laser light output unit and the kinds of wavelength conversion optical elements provided to the wavelength conversion unit is appropriately designed according to the usage and the functions of the aforementioned laser system (see Patent document #1).

In order to perform wavelength conversion by means of such a wavelength conversion optical element (non-linear optical crystal), there is a need to satisfy a phase matching condition in a wavelength conversion step. For example, in a case in which the phase matching is in critical phase matching (CPM), the angle of the wavelength conversion optical element is adjusted with respect to the laser light such that the incident angle of the laser light with respect to the optical axis of the wavelength conversion optical element matches a predetermined phase matching angle in a predetermined temperature environment. In a case in which the phase matching is in non-critical phase matching (NCPM), the temperature of the wavelength conversion optical element is adjusted such that the temperature of the non-linear optical crystal that forms the wavelength conversion element is maintained at a predetermined phase matching temperature in a predetermined laser light incident environment (in a state in which the incident angle of the laser light with respect to the optical axis of the wavelength conversion optical element is maintained at 90 degrees or otherwise 0 degrees) (see Patent documents #2 and #3).

CITATION LIST

Patent Literature

Patent document #1: Japanese Laid-Open Patent Application No. 2004-86193;
Patent document #2: Japanese Laid-Open Patent Application No. 2002-90787;
Patent document #3: Japanese Laid-Open Patent Application No. 2008-122785;

SUMMARY OF THE INVENTION

Technical Problem

The wavelength conversion optical element is cut to a suitable form and size (e.g., with an incident face of 5 mm×5 mm and a length of 20 mm, or the like) so as to provide a crystal angle that corresponds to the wavelength conversion to be provided by the wavelength conversion optical element. Thus, in the critical phase matching (CPM), after the angle of the wavelength conversion optical element is adjusted, or otherwise in the non-critical phase matching (NCPM), after the temperature of the non-linear optical crystal that provides the wavelength conversion is adjusted, for the purpose of satisfying the phase matching condition at a given incident position on the incident face, the phase matching condition should be satisfied at any incident position even after the laser light parallelly shifted relatively. However, in actuality, it is difficult to form such a non-linear optical crystal that is perfectly uniform in composition over the entire region. Furthermore, it is difficult to maintain the non-linear optical crystal at perfectly the same temperature over the entire region, and that causes a temperature distribution on the incident face. Thus, in general, a change in the incident position of the laser light leads to a situation in which the phase matching condition is not satisfied, i.e., in which a phase mismatch occurs in varying quantity.

Moreover, the wavelength conversion element receives damage due to the laser light that passes through the wavelength conversion optical element in the wavelength conversion, and gradually deteriorates. As the power of the laser light that passes through the wavelength conversion optical element becomes higher, and as the wavelength of the laser light that passes through the wavelength conversion optical element becomes shorter, the level of this deterioration becomes higher. Thus, a high-power laser device configured to input an incident laser light having the power of several tens of W or more to the wavelength conversion optical element and a laser device configured to generate laser light with the wavelength within the ultraviolet range by means of the wavelength conversion optical element are each provided with a shift mechanism that automatically parallelly shifts the wavelength conversion optical element so as to shift the incident position of the laser light every time the laser light output time reaches a predetermined period of time. It should be noted that, in some cases, such a shift mechanism is provided to a laser device in order to effectively operate the wavelength conversion optical element even if the laser light to be input to the wavelength conversion optical element does not have a high power or even if the wavelength conversion optical element does not generate laser light in the ultraviolet range.

As described above, when the wavelength conversion optical element is shifted so as to change the incident position of the laser light, this leads to a phase mismatch. The level of phase mismatch that occurs due to the shifting, i.e., the phase mismatch level, is not necessarily constant according to a constant shifting pitch. In a case in which the incident position of the laser light is in the vicinity of the edge of the incident face, a change in the phase mismatch level that occurs due to a change in the incident position can be relatively great. In order to solve such a phase mismatch problem, there is a need to perform a check operation or an adjustment operation every time the wavelength conversion optical element is shifted or otherwise for every predetermined number of times the wavelength conversion optical element is shifted, which is selectively performed according to the incident position of the laser light on the wavelength conversion element. Such arrangement configuration is required to select and execute such different work sequences, which is troublesome. In addition, this causes a difficulty in providing the laser device with an improved operation rate.

Also, it is conceivable that, even if the wavelength conversion optical element is not shifted, after high-power laser light is input to the wavelength conversion optical element for a long period of time, the refractive index of the wavelength conversion optical element will change due to the photorefractive effect or the like, leading to a phase mismatch. In this case, such an adjustment operation is required for resolving the phase mismatch in the same way as described above.

The present invention has been made in order to solve such a problem. The present invention provides a laser device which is capable of resolving a phase mismatch problem that can occur during operation, without a troublesome adjustment operation. Also, the present invention eliminates the down-time required for the adjustment operation, thereby providing an exposure device, an inspection device, and the like, having an improved operation rate.

Solution to Problems

According to the first aspect of the present invention, a laser device, comprises: a laser light output unit that outputs a fundamental wave laser light; a wavelength conversion unit that includes a wavelength conversion optical element, and that performs wavelength conversion of the fundamental wave laser light output from the laser light output unit and outputs a converted laser light; an output detector that detects a power of the converted laser light output from the wavelength conversion unit; a power feedback circuit that controls the power of the fundamental wave laser light output from the laser light output unit according to the power of the converted laser light detected by the output detector such that the power of the converted laser light output from the wavelength conversion unit is maintained in constant; a phase matching adjustment configuration configured to adjust a quantity of state that relates to phase matching at the wavelength conversion optical element so as to satisfy a phase matching condition of the wavelength conversion optical element; and a phase matching control circuit that controls setting of the quantity of state by the phase matching adjustment configuration, wherein in a state in which the power of the converted laser light is controlled to be maintained in constant by the power feedback circuit, the phase matching control circuit instructs the phase matching adjustment configuration to adjust the quantity of state in a predetermined range such that the power of the fundamental wave laser light output from the laser light output unit is minimized.

According to the second aspect of the present invention, in the laser device according to the first aspect, it is preferred that assuming that a period of a control loop set for a power controlling of the converted laser light by the power feedback circuit as pa and that a period of fluctuation of the quantity of state by the phase matching adjustment configuration as pb, a relation pb≥4 pa holds true.

According to the third aspect of the present invention, in the laser device according to the first or second aspect, it is preferred that the laser device further comprises a shift mechanism that shifts an incident position of the laser light input to the wavelength conversion optical element, wherein when the incident position of the laser light is shifted by the shift mechanism, the phase matching control circuit instructs the phase matching adjustment configuration to adjust the quantity of state.

According to the fourth aspect of the present invention, in the laser device according to any one of the first through third aspects, it is preferred that the quantity of state is a temperature of the wavelength conversion optical element; and the phase matching adjustment configuration is a temperature adjustment device that adjusts the temperature of the wavelength conversion optical element.

According to the fifth aspect of the present invention, in the laser device according to the fourth aspect, it is preferred that a phase matching state at the wavelength conversion optical element is non-critical phase matching.

According to the sixth aspect of the present invention, in the laser device according to any one of the first through third aspects, it is preferred that the quantity of state is an incident angle of the laser light input to the wavelength conversion optical element; and the phase matching adjustment configuration is an angle adjustment device that adjusts the incident angle.

According to the seventh aspect of the present invention, an exposure device comprises: the laser device according to any one of the first through sixth aspects; a mask supporting unit that holds a photomask on which a predetermined exposure pattern is formed; an exposure object supporting unit that holds an exposure object; an illumination optical system that illuminates the photomask held by the mask support unit with the laser light output from the laser device; and a projection optical system that projects a light transmitted through the photomask to the exposure object held by the exposure object supporting unit.

According to the eighth aspect of the present invention, an inspection device comprises: the laser device according to any one of the first through sixth aspects; an inspection object supporting unit that holds an inspection object; an illumination optical system that illuminates the inspection object held by the inspection object supporting unit with the laser light output from the laser device; and a projection optical system that projects a light from the inspection object to a detector.

Advantageous Effect of the Invention

With the laser device according to the present invention, in a state in which the power of the converted laser light is controlled by the power feedback circuit such that it is maintained in constant, the phase matching control circuit adjusts the quantity of state that relates to the phase matching such that the power of the fundamental laser light output from the laser light output unit is minimized, i.e., such that the wavelength conversion efficiency is maximized. Thus, such a configuration provides a laser device which is capable of resolving a phase mismatch problem that can occur in the operation without involving a troublesome adjustment operation using an adjustment jig or the like.

The exposure device according to the present invention includes such a laser device which is capable of resolving a phase mismatch problem that can occur in the operation. Thus, such a configuration does not require downtime for the phase matching adjustment operation, thereby providing an exposure device having an improved operation rate.

The inspection device according to the present invention includes such a laser device which is capable of resolving a phase mismatch problem that can occur in the operation. Thus, such a configuration does not require downtime for the phase matching adjustment operation, thereby providing an inspection device having an improved operation rate.

DESCRIPTION OF EMBODIMENTS

Figure 1:
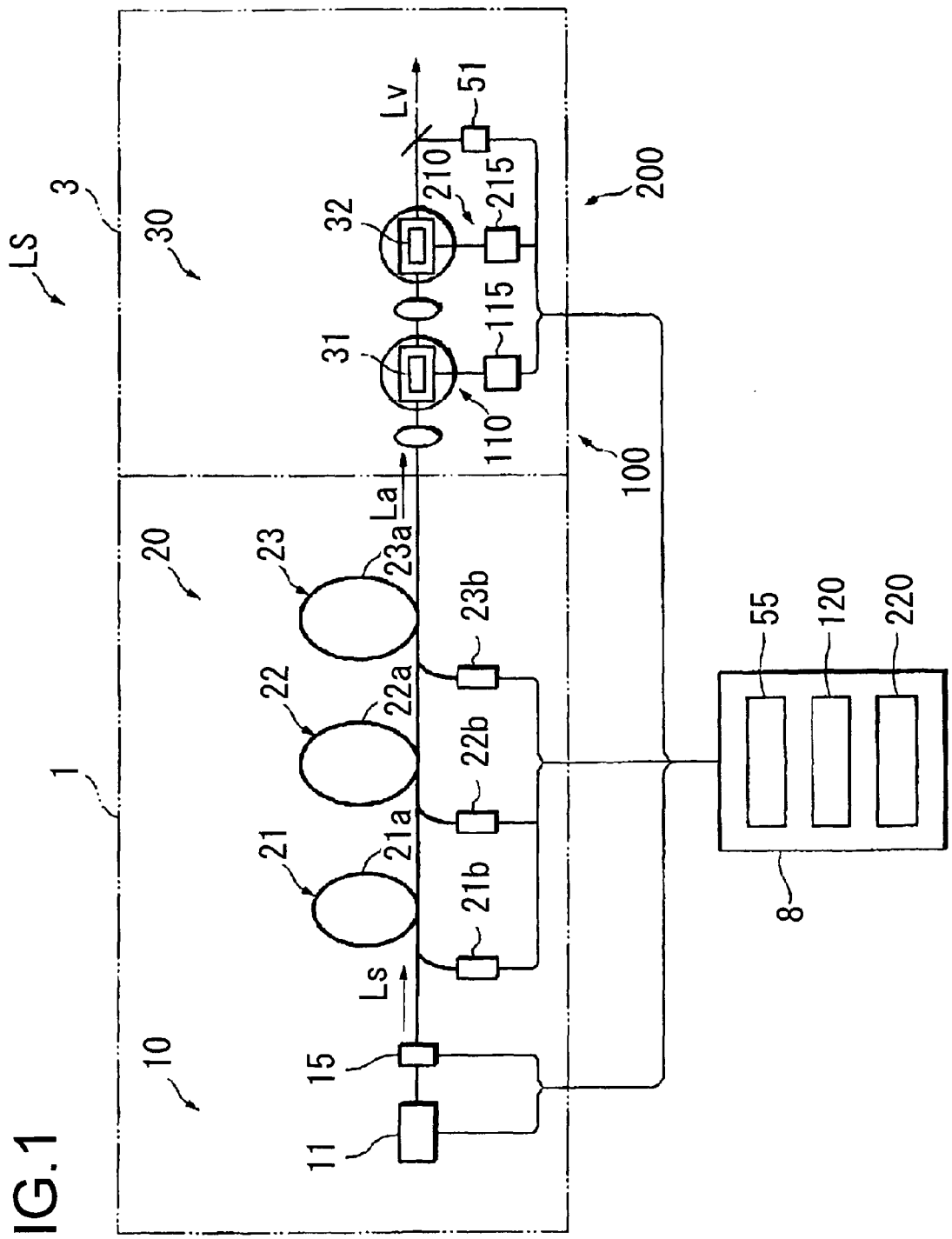
FIG. 1 is a schematic configuration diagram showing a laser device as an example of the present invention.

Description will be made below with reference to the drawings regarding an embodiment for realizing the present invention. FIG. 1 is a schematic configuration diagram showing a laser device LS as an example configuration of the present invention. The laser device LS is configured including a laser light output unit 1 that outputs a fundamental wave laser light La, a wavelength conversion unit 3 that performs wavelength conversion of the fundamental wave laser light output from the laser light output unit 1 so as to output a converted laser light Lv, and a control unit 8 that controls the operations of the laser light output unit 1 and the wavelength conversion unit 3.

Various kinds of specific configurations are known for the laser light output unit 1 and the wavelength conversion unit 3, as disclosed in Patent document #1. Description will be made in the present embodiment regarding an example in which the laser light output unit 1 outputs a fundamental wave laser light La having a wavelength of 1064 nm and the wavelength conversion unit outputs a converted laser light Lv having a wavelength of 355 nm.

The laser light output unit 1 comprises a light source unit 10 that outputs a seed light and an amplifier unit 20 that amplifies the seed light output from the light source unit 10.

The light source unit 10 mainly comprises a signal light source 11 that generates a laser light having a fundamental wavelength. As the signal light source 11, a DFB (Distributed Feedback) semiconductor laser having an oscillation wavelength in the vicinity of 1064 nm is suitably employed. By controlling the temperature of the DFB semiconductor laser by means of a temperature adjustment device using a Peltier element or the like, the DFB semiconductor laser can be controlled so as to narrow the oscillation wavelength range to a predetermined range, thereby generating a seed light having a single wavelength. Furthermore, by controlling the waveform of the excitation current that flows through the DFB semiconductor laser, the DFB semiconductor laser can perform CW oscillation or pulse oscillation with a desired magnitude.

In the present example configuration, description will be made regarding a configuration in which an external modulator 15 such as an electro-optic modulator (EOM) or the like is provided at the output end of the signal light source 11, and the pulse-oscillated output light of the signal light source 11 is cut out by the external modulator 15 so as to output the seed light Ls having a required pulse waveform to the amplifier unit 20.

The amplifier unit 20 mainly comprises a fiber amplifier that amplifies the seed light Ls output from the light source unit 10. FIG. 1 shows an example configuration in which three fiber amplifiers 21, 22, and 23 are connected in series. An ytterbium-doped fiber amplifier (YDFA) is suitably used for each of the fiber amplifiers 21, 22, and 23.

The fiber amplifier 21 mainly comprises an amplification fiber 21a having an ytterbium (Yb) doped core and an excitation light source 21b that supplies an excitation light to the amplification fiber so as to excite the ytterbium. The fiber amplifiers 22 and 23 have the same configuration as that of the fiber amplifier 21. That is to say, the fiber amplifier 22 has a configuration including an amplification fiber 22a and an excitation light source 22b, and the fiber amplifier 23 has a configuration including an amplification fiber 23a and an excitation light source 23b. As the excitation light sources 21b, 22b, and 23b, a semiconductor laser or otherwise a Raman laser may be employed, for example.

The ytterbium-doped fiber amplifier has a gain in a wavelength band ranging between 1000 and 1100 nm. Thus, the ytterbium-doped fiber amplifier is capable of amplifying the seed light Ls having a wavelength of 1064 nm with high efficiency. The gain of each fiber amplifier can be adjusted by controlling the power of the excitation light that excites the amplification fiber, and specifically, by controlling the driving electric power (excitation electric power) applied to the excitation light source 21b, 22b, or 23b.

The seed light Ls input to the amplifier unit 20 is firstly input to the first-stage fiber amplifier 21, and is amplified by the fiber amplifier 21. Subsequently, the seed light Ls is sequentially input to the second-stage fiber amplifier 22 and the third-stage fiber amplifier 23, and is sequentially amplified by the fiber amplifiers 22 and 23. The seed light amplified by these fiber amplifiers including a three-stage fiber amplifier, i.e., the fundamental wave laser light La, is output from the laser light output unit 1, and is input to the wavelength conversion unit 3. The fundamental wave laser light La output from the laser light output unit 1 has a high power on the order of 50 to 100 W. Thus, the fundamental wave laser light La having such a high power is input to the wavelength conversion unit 3.

In the present example configuration, description has been made regarding a configuration in which a three-stage fiber amplifier is provided to the amplifier unit 20 in order to output the high-power fundamental wave laser light La. Also, the fiber amplifier may be configured as a single-stage fiber amplifier or a two-stage fiber amplifier as appropriate according to the required laser power. Also, the configuration of the laser light output unit 1 is not restricted so long as it is capable of outputting the fundamental wave laser light having a required laser power. Also, the laser light output unit 1 may be configured as, for example, a fiber laser including a resonator built into its input/output end (an Yb fiber laser may be employed as the fiber laser). Also, the laser light output unit 1 may be constructed by a YAG laser or the like.

The wavelength conversion unit 3 includes a wavelength conversion optical system 30 that receives, as an incident light, the fundamental wave laser light La output from the laser light output unit 1. The wavelength conversion optical system 30 includes two wavelength conversion optical elements 31 and 32 as its main components, and is configured including unshown lenses and couplers. The fundamental wave laser light La input to the wavelength conversion unit 3 is concentrated and input to the wavelength conversion optical element 31 via the lenses.

The wavelength conversion optical element 31 is made of a non-linear optical crystal that generates the second harmonic of the fundamental wave laser light La by second harmonic generation (SHG). The fundamental wave laser light La having a wavelength of 1064 nm and input to the wavelength conversion optical element 31 is subjected to wavelength conversion in a step in which the laser light propagates through the wavelength conversion optical element 31. As a result, the wavelength conversion optical element 31 generates a laser light having a wavelength of 532 nm (which will be referred to as "532 nm light" hereafter), which is the second harmonic of the fundamental wave laser light La. In the present example configuration, an LBO ($LiB_3O_5$) crystal is employed as the wavelength conversion optical element 31. In a case of employing the LBO crystal, non-critical phase matching (NCPM) can be employed as the phase matching to be performed in the wavelength conversion for generating the 532 nm light.

Specifically, the fundamental wave laser light La is input to the incident face of the LBO crystal in a direction that is approximately orthogonal to the incident face. Furthermore, the temperature of the LBO crystal is adjusted such that the temperature satisfies the phase matching condition (crystal temperature of 148 degrees C.) in the non-crystal phase matching (NCPM), thereby providing phase matching. In a case in which non-linear critical phase matching is employed as the phase matching, such a configuration has an advantage of eliminating a walk-off phenomenon in the generation of the 532 nm light. Thus, such a configuration ensures a sufficient interaction length, thereby providing wavelength conversion with high efficiency. Furthermore, such a configuration does not have a problem of an ellipse-shaped cross-section of the output 532 nm light. Thus, such a configuration does not require a beam shaping optical element such as a cylindrical lens or the like. This allows the next-stage wavelength conversion optical element 32 to perform wavelength conversion with high efficiency.

It should be noted that as the wavelength conversion optical element 31 configured for generating the 532 nm light, PPLN (Periodically Poled $NiNbO_3$) crystal, PPLT (Periodically Poled $LiTaO_3$) crystal, PPKTP (Periodically Poled $KTiOPO_4$) crystal, BBO ($\beta$-$BaB_2O_4$) crystal, and the like can be employed according to the power of the fundamental wave laser light La input to the crystal. Either one of the polarization planes of the 532 nm light generated by the wavelength conversion optical element 31 and the fundamental wave laser light that passed through the wavelength conversion optical element 31 are rotated 90 degrees by an unshown dual wavelength wave plate, and subsequently are concentrated and input to the wavelength conversion optical element 32 via the lenses.

The wavelength conversion optical element 32 is constructed by a non-linear optical crystal that generates the sum frequency wave of the fundamental wave laser La and the 532 nm light by means of sum frequency generation (SFG). The fundamental wave laser light La and the 532 nm light input to the wavelength conversion optical element 32 are subjected to wavelength conversion in a process of propagating through the wavelength conversion optical element 32 and are turned to a laser light Lv having a wavelength of 354.6 nm (converted laser light, which will also be referred to as "355 nm light" for convenience), which is the third harmonic of the fundamental wave laser light La. An LBO crystal can be suitably employed as the wavelength conversion optical element 32. In a case in which such the LBO crystal is employed to provide wavelength conversion for generating 355 nm light, such waveform conversion is performed in a condition of type 1 critical phase matching (CPM).

Specifically, the temperature of the wavelength conversion optical element 32 is maintained at a predetermined temperature ranging between 50 and 100 degrees C. (e.g., on the order of 80 degrees C.). Furthermore, the angular position of the wavelength conversion optical element 32 is adjusted such that the incident angles of the fundamental wave laser light and the 532 nm light with respect to the optical axis of the non-linear optical crystal satisfy the phase matching condition for critical phase matching (CPM), thereby providing phase matching. It should be noted that BBO ($\beta$-$BaB_2O_4$) crystal, CLBO ($CsLiB_6O_{10}$) crystal, or the like, may be employed as the wavelength conversion optical element 32 for generating the 355 nm light.

The 355 nm light generated by the wavelength conversion optical element 32 is output from the wavelength conversion unit 3, and is output from the laser device LS as the converted laser light Lv.

The control unit 8 controls the overall operation of the laser device including the signal light source 11, the external modulator 15, and the fiber amplifiers 21 through 23. The control unit 8 includes a storage unit that stores a control program for controlling the laser device LS and various kinds of parameters, an arithmetic processing unit that executes arithmetic processing according to the control program, a driver that drives each unit, and the like. A detailed configuration is not shown in the drawings. Furthermore, a control panel for the control unit 8 includes a keyboard and various kinds of switches, which allow the operator to control the laser device, and a display panel and lamps that display the execution state of the control program, various kinds of alarms, and the like.

The wavelength conversion unit 3 includes an output detector 51 that detects the power of a diverted part of the converted laser light Lv output from the wavelength conversion optical element 32. The control unit 8 includes a power feedback circuit 55 that controls the operation of the laser light output unit 1 such that the power of the converted laser light output from the wavelength conversion unit 3 matches a predetermined power. The power feedback circuit 55 makes a comparison between an output command value specified by the control program that controls the laser device LS and the power of the converted laser light Lv detected by the output detector 51. The power feedback circuit 55 controls the power of the fundamental wave laser light La output from the laser light output unit 1 such that the power of the converted laser light Lv matches the output command value.

For example, when the power of the converted laser light Lv detected by the output detector 51 is lower than the output command value specified by the control program, the power feedback circuit 55 performs a control so as to raise the power of the fundamental wave laser light La output from the laser light output unit 1 according to the difference thereof thus detected, such that the power of the converted laser light Lv matches the output command value (such that the power of the converted laser light Lv is within a predetermined range with the output command value as the center). For example, the power feedback circuit 55 controls the power of the excitation light output from the excitation light source 23b included in the fiber amplifier 23 so as to adjust the gain of the amplification fiber 23a, thereby allowing the power of the fundamental wave laser light La output from the laser light output unit 1 to be controlled. The period pa of the control loop set for the power feedback circuit 55 for controlling the power of the converted laser light Lv is set from 10 msec to 1 sec (e.g., 10 msec, which corresponds to a control frequency fa on the order of 100 Hz). Such a configuration provides a short-period feedback operation for the converted laser light power.

In a state in which the laser power is controlled by the power feedback circuit 55 as explained above, the power of the converted laser light Lv output from the wavelength conversion unit 3 is maintained in constant according to the output command value specified by the control program.

Figure 2:
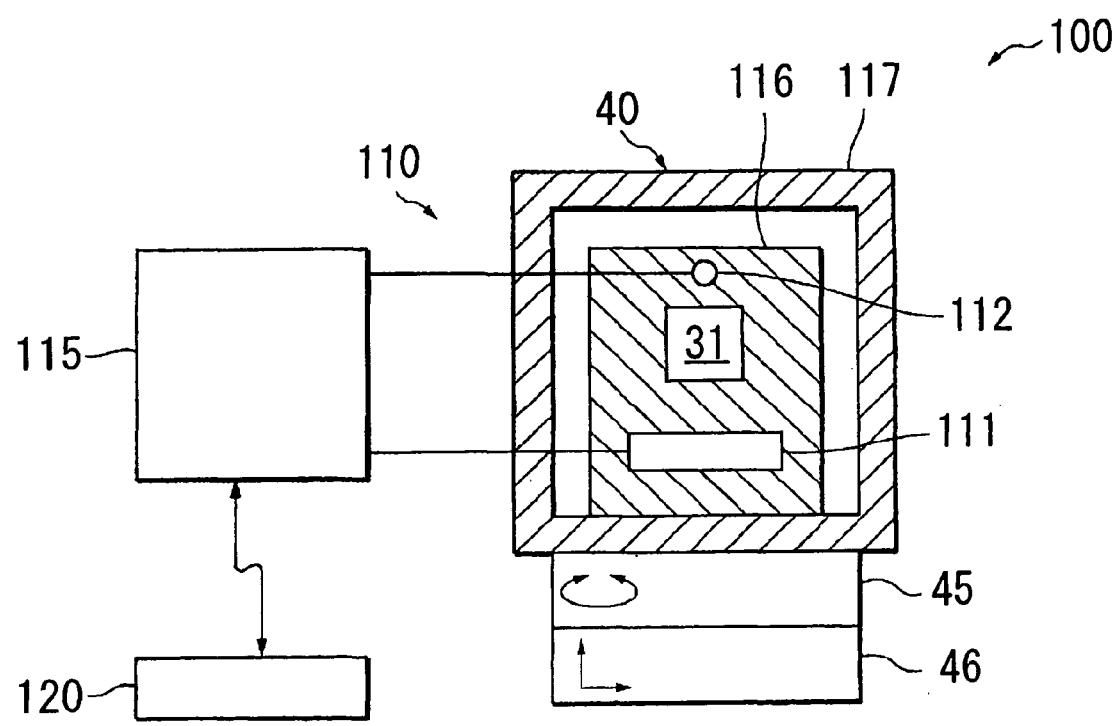
FIG. 2 is a schematic configuration diagram showing a phase matching optimization device according to a first embodiment.

In the laser device LS having the aforementioned example configuration, the wavelength conversion unit 3 includes a shift mechanism that shifts, at predetermined time interval, the incident position of the laser light (fundamental laser light or 532 nm light) input to the wavelength conversion optical element 31 or 32. Furthermore, the laser device LS includes a phase matching optimization device that optimizes the phase matching state (minimize the degree of phase mismatch) at the wavelength conversion optical element. First, description will be made regarding the phase matching optimization device 100 according to the first embodiment with reference to an example in which the phase matching optimization device is applied to the wavelength conversion optical element 31. FIG. 2 is a diagram showing a schematic configuration of the phase matching optimization device 100 in which the wavelength conversion optical element 31 is shown as its cross-sectional view taken along a plane that is orthogonal to the laser light to be input thereto.

The phase matching optimization device 100 includes: a temperature adjustment device 110 configured to adjust a quantity of state that corresponds to the phase matching at the wavelength conversion optical element 31, i.e., the temperature of the wavelength conversion optical element 31 in the present embodiment; and a phase matching control circuit 120 that controls the temperature control of the temperature controller 110.

As described above, as in the wavelength conversion by the wavelength conversion optical element 31 for generating the 532 nm light, non-critical phase matching (NCPM) is performed as the phase matching state, the temperature (crystal temperature) of the portion through which the laser light passes is adjusted such that it is maintained at a predetermined phase matching temperature (148 degrees C.) so as to satisfy the phase matching condition. Accordingly, the temperature adjustment device 110 comprises a heater 111, a temperature sensor 112, a temperature controller 115, and the like. The wavelength conversion optical element 31 is held by a crystal holder 116 including the heater 111 and the temperature sensor 112 as built-in components, and is covered with a thermal insulation cover 117 except for the input/output face.

A crystal unit 40 configured as a single unit comprising such components is mounted on a crystal angle adjuster 45 which allows the crystal unit 40 to be angular adjusted by rotating around the vertical axis, thereby allowing the incident angle adjustment of the fundamental wave laser light La input to the wavelength conversion optical element 31. Furthermore, the crystal unit 40 is mounted on a shift mechanism 46 via the crystal angle adjuster 45, which allows the crystal unit 40 to be shifted in the horizontal direction and in the vertical direction on a plane that is orthogonal to the optical axis of the fundamental wave laser light La. This allows the incident position of the fundamental wave laser light La entering to the wavelength conversion optical element 31 to be adjusted. The operation of the shift mechanism 46 is controlled by the control unit 8.

The control unit 8 outputs a shift signal that instructs the shift mechanism 46 to perform a shift operation, so as to shift the wavelength conversion optical element 31 by a predetermined length, every time the output time during which the converted laser light is output to a given incident position reaches a predetermined period of time. As a result, the incident position of the fundamental wave laser light La is shifted to a new position.

The control unit 8 includes the phase matching control circuit 120 configured including a comparison unit, an arithmetic unit, an I/O unit, and the like. Specifically, the phase matching control is performed by executing a phase matching control program installed in a personal computer which constitutes the control unit 8. The phase matching control circuit 120 receives, as input signals, an APC signal which indicates whether or not the power controlling state in which the power of the converted laser light is controlled by the power feedback circuit 55 such that it is maintained in constant is established, a shift signal that instructs the shift mechanism 46 to shift the wavelength conversion optical element 31, a signal that corresponds to the power of the excitation light for exciting the fiber amplifiers 21 through 23 (e.g., signals which correspond to the excitation electric power supplied to the excitation light sources 21b, 22b, and 23b, which will be referred to as "PP signal" hereafter), and the like.

In the ON state of the APC signal, which indicates that the power of the converted laser light is controlled by the power feedback circuit 55 such that it is maintained in constant, when the shift signal is input, which instructs the shift mechanism 46 to shift the wavelength conversion optical element 31, the phase matching control circuit 120 outputs a phase matching adjustment signal to the temperature controller 115 configured to control the temperature adjustment device 110 so as to adjust the temperature of the wavelength conversion optical element 31 in a predetermined range.

When the phase matching adjustment signal is input to the temperature controller 115 from the phase matching control circuit 120, the temperature controller 115 controls the electric power supplied to the heater 111 so as to adjust the amount of heat generation of the heater 111 such that the temperature fluctuation of the wavelength conversion optical element 31 is controlled in a predetermined temperature range.

Figure 3:
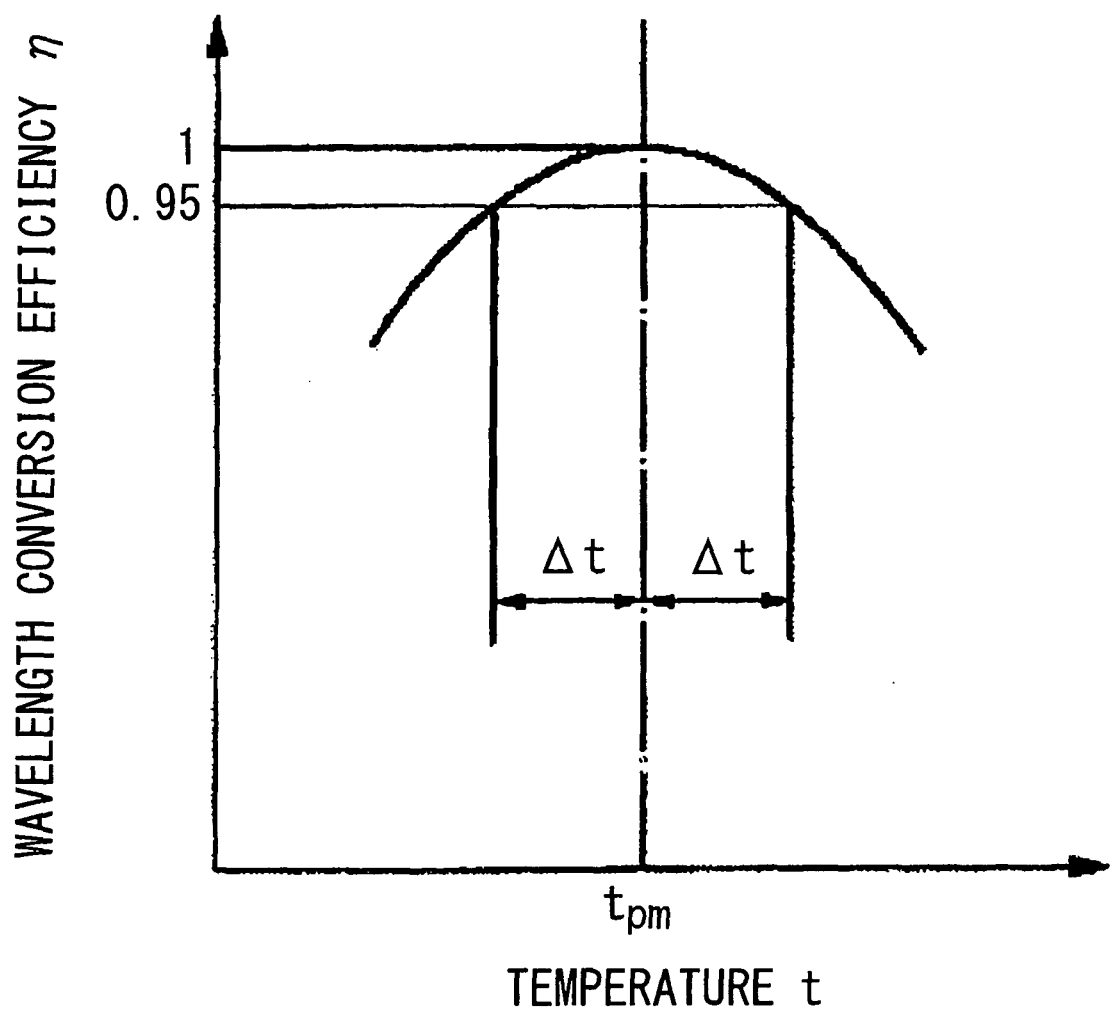
FIG. 3 is a graph showing a relation between the temperature of a wavelength conversion optical element and the wavelength conversion efficiency thereof.

FIG. 3 shows the relation between the temperature t of the wavelength conversion optical element 31 and the wavelength conversion efficiency η of the wavelength conversion optical element 31. It should be noted that the wavelength conversion efficiency which is shown on the vertical axis, is normalized with the wavelength conversion efficiency in a state in which the phase matching condition is satisfied as 1. As shown in FIG. 3, the wavelength conversion efficiency η of the wavelength conversion optical element 31 is maximized when the temperature of a portion of the wavelength conversion optical element 31 through which the laser light passes is equal to the temperature tpm ("phase matching temperature" tpm=148 degrees C. in the present example configuration), and decreases as the temperature t deviates from the phase matching temperature tpm toward either the high temperature side or the low temperature side.

There is a known relation with respect to the wavelength conversion optical element 31 between the temperature of a portion through which laser light passes and the wavelength conversion efficiency η. The temperature controller 115 sets the temperature range Δt such that the reduction of the wavelength conversion efficiency η is maintained less than on the order of 5%. The temperature controller 115 controls the electric power to be supplied to the heater 111 according to the temperature of the wavelength conversion optical element 31 detected by the temperature sensor 112 such that the temperature of the wavelength conversion optical element 31 fluctuates in a sine wave shape in the aforementioned predetermined temperature range. Such a control for maintaining the temperature of the wavelength conversion optical element 31 such that it fluctuates in a sine wave shape in a predetermined temperature range will be referred to as "temperature modulation control" in the present specification.

The period of the temperature modulation control (period of the sine wave curve) pb is set so as to satisfy the relation pb≥4 pa, assuming the period pa of the control loop set for the power controlling by the power feedback circuit 55. In the present example configuration, the period pa of the control loop set for the power control is set from 10 msec to 1 sec, and the period pb set for the temperature modulation control is set from 5 to 15 sec (e.g., on the order of 10 sec). It should be noted that the specific value of the period pb of the temperature modulation control is determined giving consideration to the thermal conditions such as the heating capability of the heater 111, the thermal capacity of the crystal holder 116 and the like, and the time required to optimize the temperature of the wavelength conversion optical element 31 and the like, in addition to the relation between the period pa of the control loop and the period pb of the temperature modulation control.

In a state in which the power of the converted laser light is maintained in constant by means of the power feedback circuit 55 as described above, and the temperature of the wavelength conversion optical element 31 is controlled such that it fluctuates in a sine wave shape by means of the temperature controller 115, the phase matching control circuit 120 monitors PP signal that corresponds to the power of the excitation light that excites the fiber amplifiers 21 through 23.

Figure 4:
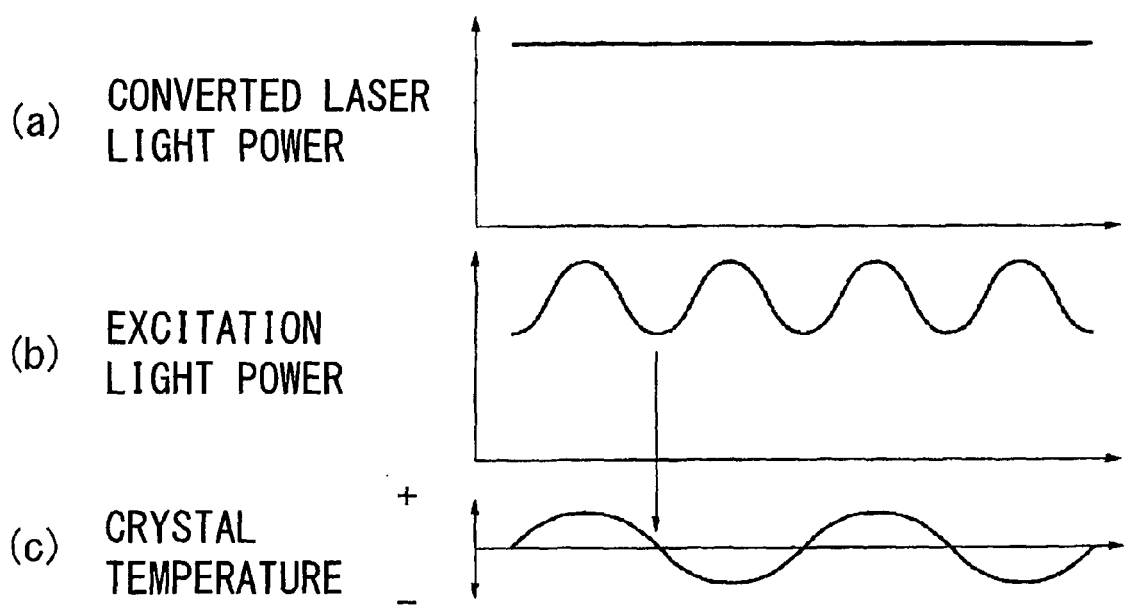
FIG. 4 is an explanatory diagram for describing the adjustment operation of the phase matching optimization device.

FIG. 4 shows, during the aforementioned control, changes over time of (a) the power of the converted laser light Lv, (b) the power of the excitation light for exciting the fiber amplifiers 21 through 23 (PP signal), and (c) temperature fluctuation of the wavelength conversion optical element 31.

The power of the converted laser light shown in FIG. 4A is maintained in constant by means of the power control of the power feedback circuit 55.

The temperature of the wavelength conversion optical element 31 shown in FIG. 4C is controlled such that it fluctuates in a sine wave shape by means of the temperature modulation control of the temperature controller 115. The period pb of the temperature modulation control is set so as to satisfy the relation pb≥4 pa, assuming the period of the power control of the power feedback circuit as pa. Thus, the temperature of the wavelength conversion optical element 31 is controlled such that it fluctuates in a sine wave shape while the power of the converted laser light is in a state of being stably controlled.

On the other hand, what it is that the temperature of the wavelength optical element 31 fluctuates means that the wavelength conversion efficiency η of the wavelength conversion optical element 31 fluctuates (see FIG. 3). Furthermore, the what it is that the power of the converted laser light Lv is maintained in constant although the wavelength conversion efficiency η fluctuates means that the power of the fundamental wave laser light La input to the wavelength conversion optical element 31 is controlled to increase and decrease by the feedback circuit 55. That is to say, this means that the power of the excitation light for exciting the fiber amplifier 23 is controlled to increase and decrease.

FIG. 4B shows the control in this situation. When the crystal temperature, which is the temperature of a portion of the wavelength conversion optical element 31 through which the laser light passes, matches the phase matching temperature tpm which satisfies the phase matching condition, the power of the excitation light is minimized (the wavelength conversion efficiency is maximized), and becomes greater when the crystal temperature deviates from the phase matching temperature tpm toward the high temperature side or the low temperature side.

The phase matching control circuit 120 monitors the PP signal, which is a signal that corresponds to the power of the excitation light, and calculates the temperature (which will be referred to as the "optimization temperature") at which the power of the excitation light is minimized in the power feedback control. The phase matching control circuit 120 outputs a constant temperature control signal to the temperature controller 115 so as to control the temperature of the wavelength conversion optical element 31 such that it becomes constant at the optimization temperature. The temperature controller 115 controls the operation of the heater 111 according to the constant temperature control signal output from the phase matching control circuit 120, so as to adjust the temperature of the wavelength conversion optical element 31 such that it becomes the optimization temperature. The temperature controller 115 controls the temperature of the wavelength conversion optical element 31 such that it becomes approximately constant at the optimization temperature until the next shift signal is input.

Even when the shift mechanism 46 shifts the incident position of the fundamental wave laser light input to the wavelength conversion optical element 31 and the phase mismatch occurred at the incident position, the phase matching optimization device 100 performs such a control so as to automatically resolve a phase mismatch and provides a state in which the converted laser light is output at a constant power with high efficiency. Therefore, a phase mismatch problem while operating the laser device LS can be resolved without involving suspension of the operation in order to adjust the phase matching condition and without involving a jig to be set for adjustment. Thus, such a configuration allows the converted laser light to be output with high efficiency at all times. This provides a laser device having an improved operation rate and improved power efficiency.

Description has been made above regarding the embodiment in which non-critical phase matching (NCPM) is employed as the phase matching condition at the wavelength conversion optical element. However, the present invention may be applied to a configuration in which critical phase matching (CPM) is employed as the phase matching condition. In this case, the change in the wavelength conversion efficiency that occurs due to the change in the temperature of the wavelength conversion optical element is gentler than that in the example shown in FIG. 3. Thus, although the temperature range for the temperature control of the temperature adjustment device 110 for the wavelength conversion optical element is greater than that for a configuration in which non-critical phase matching is employed, the same control can be applied so as to provide an optimized phase matching state.

Description has been made in the present embodiment regarding an example in which the phase matching optimization device 100 optimizes the phase matching condition when the shift mechanism 46 shifts the wavelength conversion optical element 31. Also, a configuration may be made in which the phase matching condition is optimized regardless of the presence or absence of the shift operation. For example, a configuration may be made in which the optimizing operation is performed every time the output time during which the converted laser light is output from the laser device reaches a predetermined period of time. Also, a configuration may be made in which, when the incident position of the fundamental wave laser light input to the wavelength conversion optical element 31 is in the vicinity of the edge of the incident face, the optimizing operation is performed. Also, a configuration may be made such that the optimizing operation is performed at all times.

Figure 5:
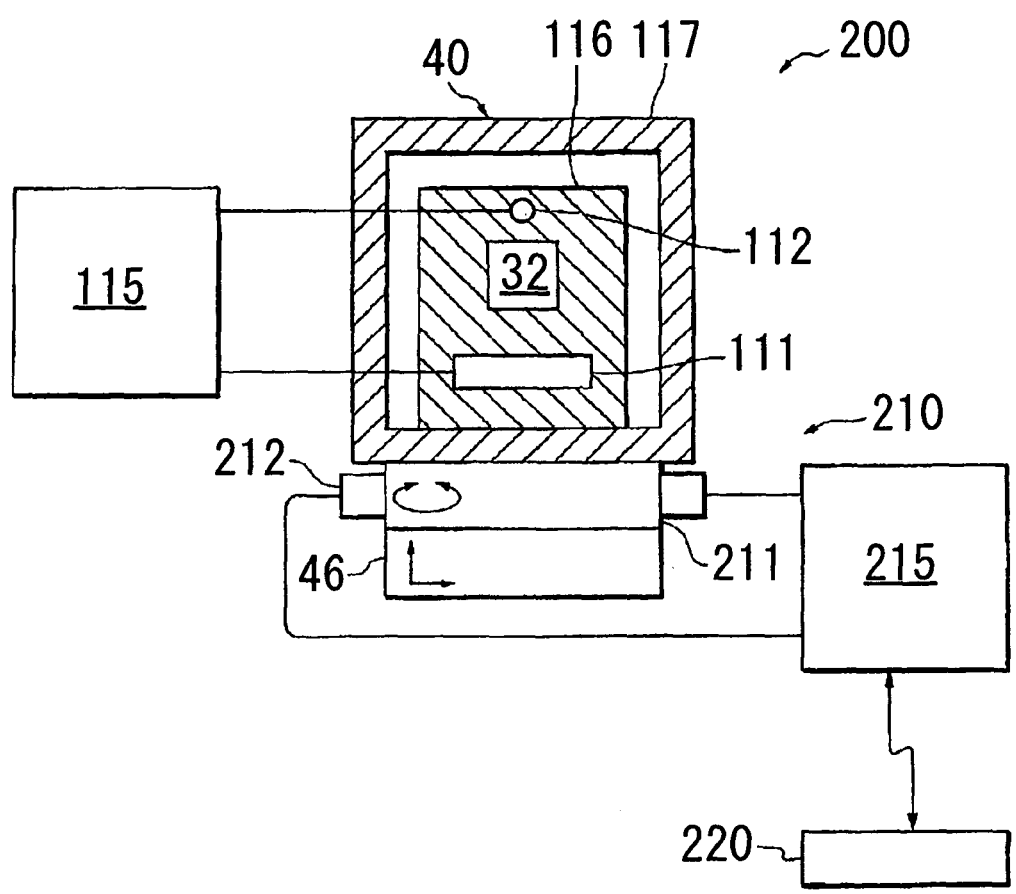
FIG. 5 is a schematic configuration diagram showing a phase matching optimization device according to a second embodiment.

Next, description will be made regarding a phase matching optimization device 200 according to a second embodiment with reference to an example in which the phase matching optimization device is applied to the wavelength conversion optical element 32. FIG. 5 is a diagram showing a schematic configuration of the phase matching optimization device 200 in which the wavelength conversion optical element 32 is shown as its cross-sectional view taken along a plane that is orthogonal to the laser light to be input thereto.

The phase matching optimization device 200 according to the second embodiment includes: an angle adjustment device 210 configured to adjust a quantity of state that corresponds to the phase matching at the wavelength conversion optical element 32, i.e., in the present embodiment, the incident angle of the 532 nm light input to the wavelength conversion optical element 32; and a phase matching control circuit 220 that controls the angle setting performed by the angle adjustment device 210.

As described above, as in the wavelength conversion by the wavelength conversion optical element 32 for generating the 355 nm light, critical phase matching (CPM) is performed as the phase matching state, the incident angle of the 532 nm light input to the wavelength conversion optical element 32 is adjusted such that it matches a predetermined phase matching angle so as to satisfy the phase matching condition. Accordingly, the temperature adjustment device 210 is configured to be capable of electrically controlling, from the outside, the aforementioned crystal angle adjuster 45. The angle adjustment device 210 comprises a rotating stage 211 that allows the crystal holder 116 to be rotated around the vertical axis by means of a stepping motor or the like, a rotary encoder 212 that detects the angle position of the rotating stage 211, a stage controller 215 that controls an operation of the rotating stage 211, and the like.

That is to say, the phase matching optimization device 200 according to the second embodiment has the same basic configuration as that of the phase matching optimization device 100 according to the first embodiment described above except that the angle of the wavelength conversion optical element is controlled instead of the temperature thereof. Accordingly, brief description will be made below with the same components denoted by the same reference numerals, and redundant description will be omitted.

The phase matching control circuit 220 receives, as input signals, an APC signal which indicates whether or not the power controlling state in which the power of the converted laser light is controlled by the power feedback circuit 55 such that it is maintained in constant is established, a shift signal that instructs the shift mechanism 46 to shift the wavelength conversion optical element 32, and a PP signal that corresponds to the power of the excitation light for exciting the fiber amplifiers 21 through 23.

In the ON state of the APC signal, which indicates that the power of the converted laser light is controlled such that it is maintained in constant, when the shift signal is input, which instructs the shift mechanism 46 to shift the wavelength conversion optical element 32, the phase matching control circuit 220 outputs a phase matching adjustment signal to the stage controller 215 configured to control the angle adjustment device 210. When the phase matching adjustment signal is input to the stage controller 215 from the phase matching control circuit 220, the stage controller 215 outputs a driving signal to the rotating stage 211 so as to swing the wavelength conversion optical element 32 in a predetermined turn angle range.

Figure 6:
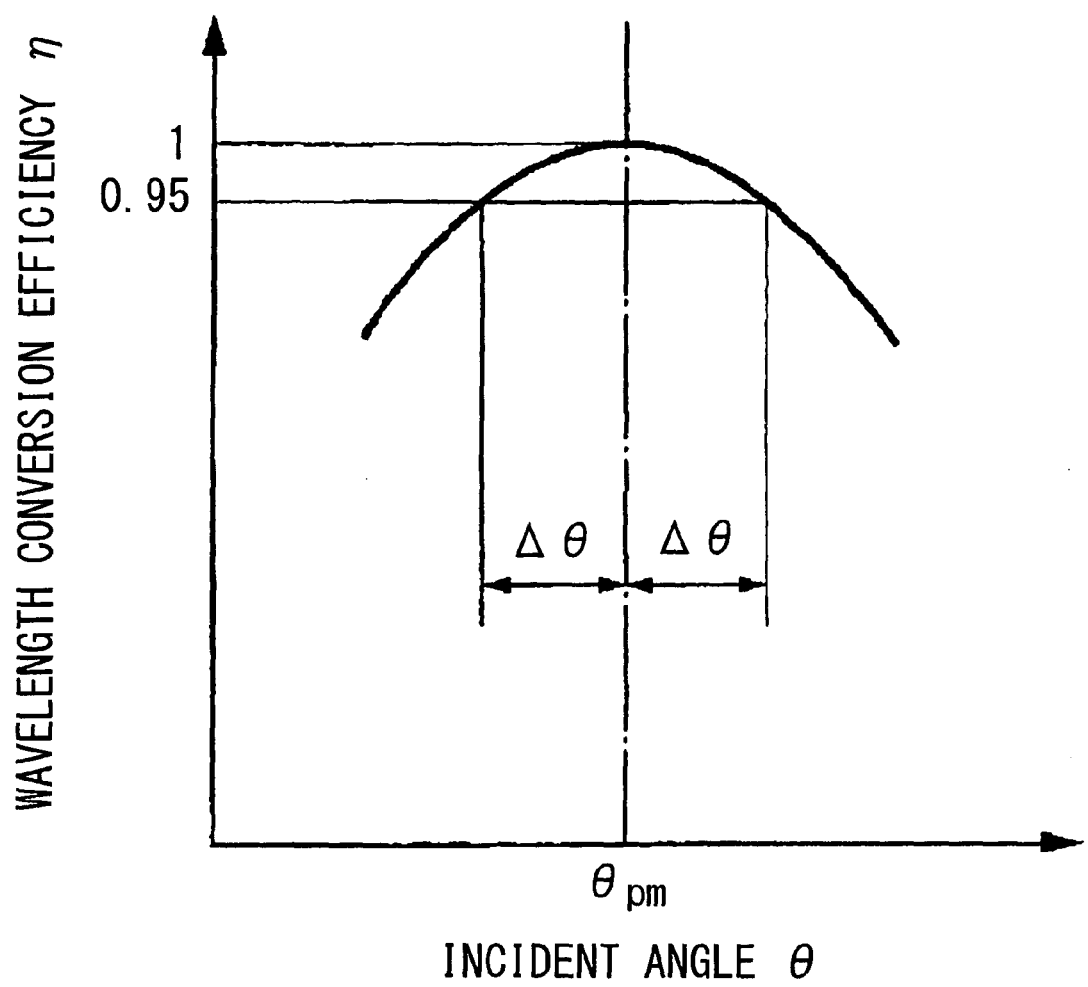
FIG. 6 is a graph showing a relation between the incident angle of the laser light input to the wavelength conversion optical element and the wavelength conversion efficiency.

FIG. 6 shows the relation between the incident angle $\theta$ of the 532 nm light input to the wavelength conversion optical element 32 and the wavelength conversion efficiency $\eta$ of the wavelength conversion optical element 32. The wavelength conversion efficiency $\eta$ is normalized with the wavelength conversion efficiency in a state in which the phase matching condition is satisfied as 1. As shown in FIG. 6, the wavelength conversion efficiency $\eta$ of the wavelength conversion optical element 32 is maximized when the incident angle $\theta$ of the 532 nm light matches the phase matching angle $\theta$pm, and decreases as the incident angle $\theta$ deviates from the phase matching angle $\theta$pm.

There is a known relation with respect to the wavelength conversion optical element 32 between the incident angle of the laser light and the wavelength conversion efficiency $\eta$. The stage controller 215 sets the angle range $\Delta\theta$ such that the reduction of the wavelength conversion efficiency $\eta$ is maintained less than on the order of 5%. The stage controller 215 drives the rotating stage 211 according to the angle of the wavelength conversion optical element 32 detected by the rotary encoder 212, and controls the wavelength conversion optical element 32 so as to swing in the predetermined angle range. Such a control for swinging the wavelength conversion optical element 32 in the predetermined angle range will be referred to as "angle modulation control" in the present specification.

The period of the angle control (swinging period) pb is set so as to satisfy the relation pb≥4 pa, assuming the period pa of the control loop set for the power control by the power feedback circuit 55. In the present embodiment, the period pa of the control loop set for the power control is set from 10 msec to 1 sec, and the period pb set for the angle modulation control is set from 1 to 10 sec (e.g., on the order of 5 sec).

In a state in which the power of the converted laser light is maintained in constant by means of the power feedback circuit 55 as described above, and the swinging of the wavelength conversion optical element 32 is controlled by the stage controller 215, the phase matching control circuit 220 monitors the PP signal that corresponds to the power of the excitation light that excites the fiber amplifiers 21 through 23.

In this state, the power of the converted laser light Lv, the fluctuation of the power of the excitation light for exiting the fiber amplifiers 21 through 23, and the like, are approximately the same as those shown in FIGS. 4A and 4B. Also, in the present embodiment, the angle $\theta$ of the wavelength conversion optical element 32 can be represented as shown in FIG. 4C if the temperature t of the wavelength conversion optical element 31 shown on the vertical axis in FIG. 4C is replaced by the angle $\theta$ of the wavelength conversion optical element 32.

When the angle of the wavelength conversion optical element 32, i.e., the incident angle of the 532 nm light, matches the phase matching angle θpm, the power of the excitation light is minimized (i.e., the wavelength conversion efficiency is maximized), and becomes greater as the deviation of the incident angle of the 532 nm light from the phase matching angle θpm becomes greater (see FIG. 4B).

The phase matching control circuit 220 monitors the PP signal, which is a signal that corresponds to the power of the excitation light, and calculates the angle of the wavelength conversion optical element 32 (which will be referred to as the "optimum angle") at which the power of the excitation light is minimized under the power feedback control. The phase matching control circuit 220 outputs, to the stage controller 215, a fixing position control signal which is an instruction to set the angle position of the wavelength conversion optical element 32 to the optimum angle. The stage controller 215 drives the rotating stage 211 according to the fixing position control signal output from the phase matching control circuit 220, so as to adjust the angle position of the wavelength conversion optical element 32 at the optimum angle. The rotating stage 211 holds the wavelength conversion optical element 32 at this optimum angle until the next shift signal is input.

The shift mechanism 46 shifts the incident position of the fundamental wave laser light input to the wavelength conversion optical element 32. Thereby, it is capable to provide a state in which the converted laser light is output at a constant power with high efficiency by a performance of the phase matching optimization device 200 that automatically resolves a phase mismatch even if the phase mismatch occurred at the incident position. As a result, the phase mismatch problem while operating the laser device LS can be resolved without involving suspension of the operation in order to adjust the phase matching condition and without involving a jig set for adjustment. Thus, such a configuration allows the converted laser light to be output with high efficiency at all times. This provides a laser device having an improved operation rate and improved power efficiency.

Description has been made above regarding a configuration in which, when the wavelength conversion optical element 32 is shifted by the shift mechanism 46, the phase matching optimization device 200 optimizes the phase matching condition. Also, the phase matching condition may be optimized regardless of presence or absence of the shift operation.

Description has been made above as an example regarding a configuration in which the laser light output unit 1 outputs the fundamental wave laser light having a wavelength of 1064 nm, and the laser light is wavelength converted into the converted laser light having a wavelength of 355 nm by means of the two wavelength conversion optical elements 31 and 32 provided to the wavelength conversion unit 3. Also, the wavelength of the fundamental wave laser light and the wavelength of the converted laser light, and the number of wavelength conversion optical elements, their arrangement, and the like, may be determined arbitrarily. For example, a configuration may be made in which the laser light output unit 1 outputs fundamental wave laser light having a wavelength band of 1.5 μm, and the fundamental wave laser light is converted by multiple wavelength conversion optical elements into converted laser light having a wavelength of 193 nm and output.

The laser device LS as described above is compact size, light weight, and easy to operate. Thus, such a laser device LS is suitably applicable to various kinds of systems such as optical processing devices such as an exposure devices, an optical shaping devices, and the like; inspection devices such as an inspection devices for photomasks or wafers, and the like; observing devices such as a microscopes, telescopes, and the like; measuring devices such as a length measurement instruments, a form measurement devices, and the like; and optical therapy devices, and the like.

Figure 7:
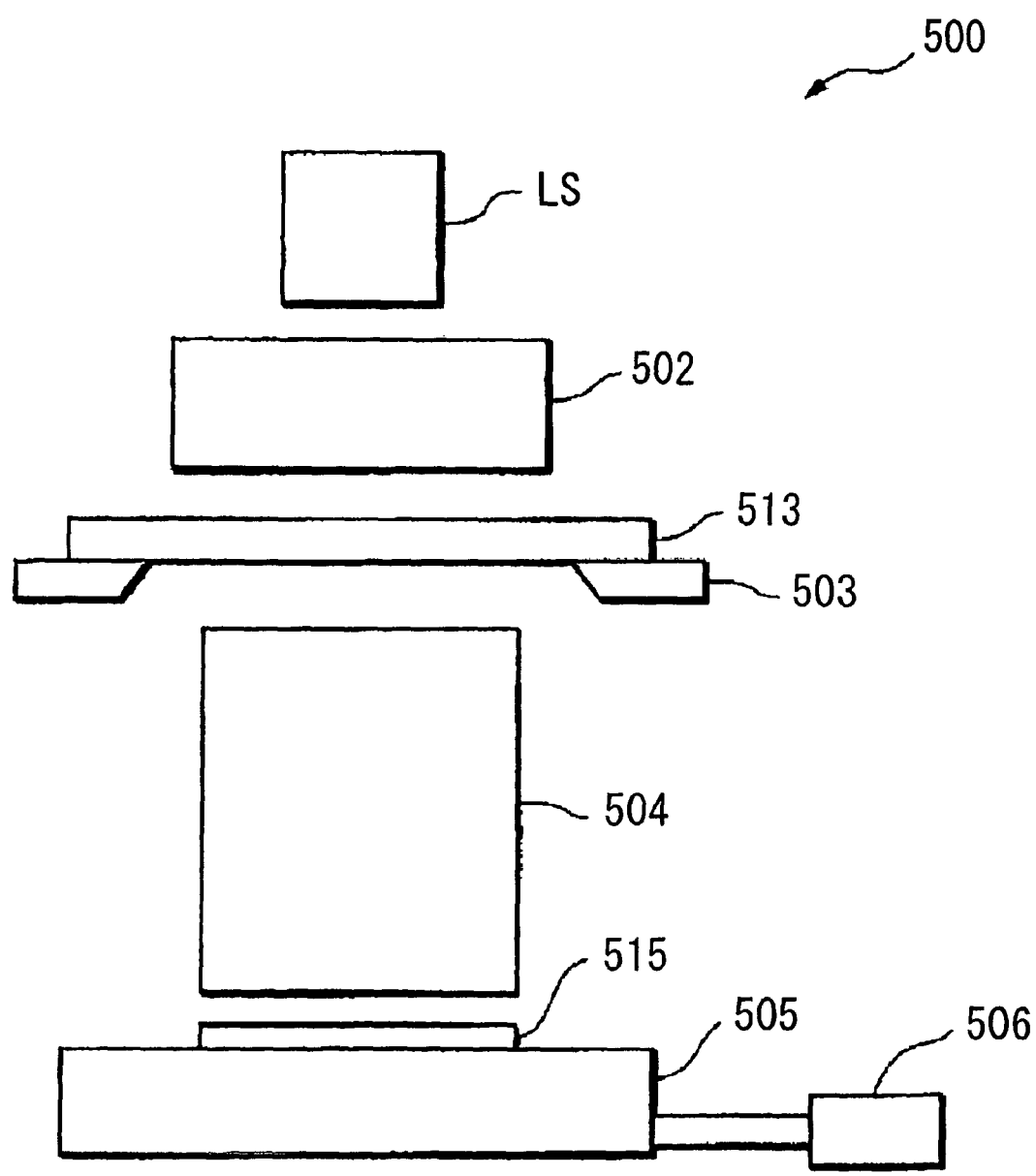
FIG. 7 is a schematic configuration diagram showing an exposure device as a first example of application system including the laser device according to the present invention.

As a first application example of the system including the laser device LS, description will be made regarding an exposure device used in a photolithography processes in semiconductor device manufacturing or liquid crystal panel manufacturing with reference to FIG. 7 showing the schematic configuration thereof. In principle, an exposure device 500 is configured to operate in the same manner as in photoengraving. Specifically, a fine pattern formed on a photomask 513 made of silica glass is projected to an exposure object 515 such as a semiconductor wafer or a glass substrate coated with photoresist using an optical projection method.

The exposure device 500 is configured including the aforementioned laser device LS, an illumination optical system 502, a mask supporting base 503 that holds the photomask 513, a projection optical system 504, an exposure object supporting table 505 that holds the exposure object 515, and a driving mechanism 506 that moves the exposure object supporting table 505 in a horizontal plane. The illumination optical system 502 comprises a plurality of lens groups illuminates the photomask 513 held on the mask supporting base 503 with the laser light output from the laser device LS. The projection optical system 504 comprises a plurality of lens groups projects the light transmitted through the photomask 513 onto the exposure object 515 held on the exposure object supporting table.

In such configuration of the exposure device 500, the laser light output from the laser device LS is input to the illumination optical system 502, and then the photomask 513 held by the mask supporting base 503 is exposed to the laser light adjusted to the predetermined light flux. The pattern image formed on the photomask 513 focused on a predetermined position of the exposure object 515 held by the exposure object supporting table 505 via the projection optical system 504. Thus, the pattern image formed on the photomask 513 is projected onto the exposure object 515 such as a semiconductor wafer or a glass substrate for liquid crystal panel or the like at a predetermined magnification.

As such an exposure device 500 includes a laser device having a high operation rate and high power efficiency, it is possible to realize an advantage of reduced downtime, i.e., having improved operation rate.

Figure 8:
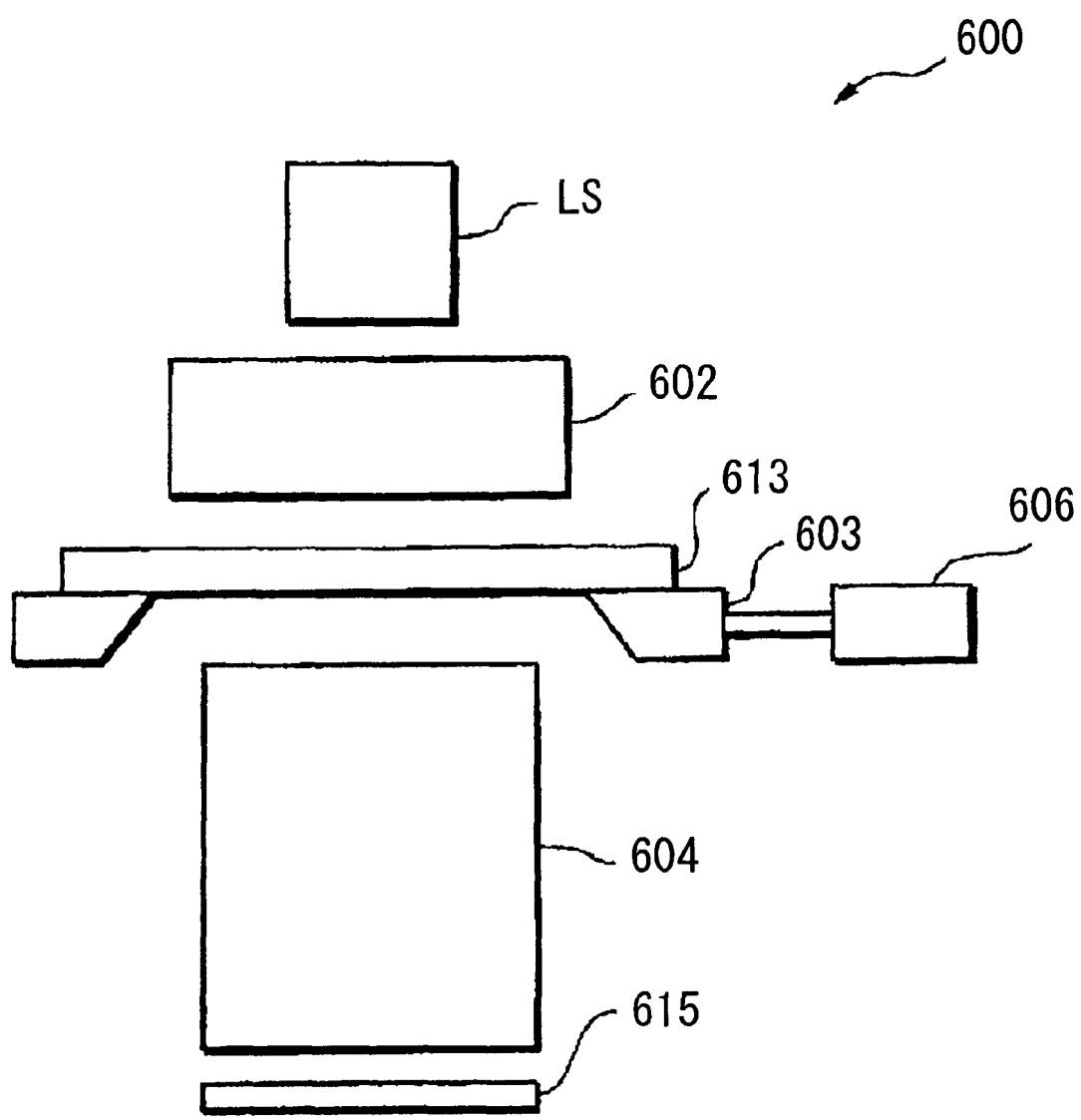
FIG. 8 is a schematic configuration diagram showing an inspection device as a second example of application system including the laser device according to the present invention.

Next, as a second application example of the system including the laser device LS, description will be made regarding an inspection device used in an inspection processes for inspecting a photomask, a liquid crystal panel, a wafer, or the like (an inspection object), with reference to FIG. 8 showing the schematic configuration thereof. An inspection device 600 is suitably used in an inspection for inspecting a fine pattern formed on an inspection object 613 having optical transparency such as a photomask or the like.

The inspection device 600 is configured including the aforementioned laser device LS, an illumination optical system 602, an inspection object supporting base 603 that holds the inspection object 613, a projection optical system 604, a TDI (Time Delay Integration) sensor 615 that detects light from the inspection object 613, and a driving mechanism 606 that moves the inspection object supporting base 603 in a horizontal plane. The illumination optical system 602 comprises a plurality of lens groups illuminates the inspection object 613 held on the inspection object supporting base 603 with the laser light output from the laser device LS as a predetermined light flux. The projection optical system 604 comprises a plurality of lens groups, projects the light passed through the inspection object 613 onto the TDI sensor 615.

In such configuration of the inspection device 600, the laser light output from the laser device LS is input to the illumination optical system 602 and then the inspection object 613 such as a photomask or the like held by the inspection object supporting base 603 is exposed to the laser light adjusted to the predetermined light flux. The light from the inspection object 613 (transmitted light in the present example) including an image of a pattern formed on the inspection object 613 is focused on the TDI sensor 615 via the projection optical system 604. With such a configuration, the horizontal moving speed of the object supporting base 603 driven by the driving mechanism 606 is controlled in synchronization with the transfer clock applied to the TDI sensor 615.

The image of the pattern on the inspection object 613 is detected by the TDI sensor 615 and is compared with a predetermined reference image set beforehand. Thereby, when the pattern formed on the inspection object has a defect, it is capable to extract it. It should be noted that, in a case in which the inspection object 613 has no transparency like a wafer or the like, the inspection device may have the same configuration except that reflected light from the inspection object is input to the projection optical system 604 such that it is guided to the TDI sensor 615.

Such an exposure device 600 includes a laser device having a high operation rate and high power efficiency provides an inspection device having an advantage of reduced downtime, i.e., having improved operation rate.

While various embodiments and variant examples have been explained in the above description, the present invention should not be considered as being limited by the details thereof. The scope of the invention includes the other embodiments within the scope of the technical ideas of the present invention.

The disclosures of the following priority patent application is hereby incorporated by reference:

Japanese Patent Application No. 2012-048211 (filed on Mar. 5, 2012).

The invention claimed is:

1. A laser device comprising:
   a laser light output unit that outputs a fundamental wave laser light;
   a wavelength conversion unit that includes a wavelength conversion optical element, and that performs wavelength conversion of the fundamental wave laser light output from the laser light output unit and outputs a converted laser light;
   an output detector that detects a power of the converted laser light output from the wavelength conversion unit;
   a power feedback circuit that controls the power of the fundamental wave laser light output from the laser light output unit according to the power of the converted laser light detected by the output detector such that the power of the converted laser light output from the wavelength conversion unit is maintained in constant;
   a phase matching adjustment configuration configured to adjust a quantity of state that relates to phase matching at the wavelength conversion optical element so as to satisfy a phase matching condition of the wavelength conversion optical element; and
   a phase matching control circuit that controls setting of the quantity of state by the phase matching adjustment configuration, wherein
   in a state in which the power of the converted laser light is controlled to be maintained in constant by the power feedback circuit, the phase matching control circuit instructs the phase matching adjustment configuration to adjust the quantity of state in a predetermined range such that the power of the fundamental wave laser light output from the laser light output unit is minimized.

2. The laser device according to claim 1, wherein assuming that a period of a control loop set for a power controlling of the converted laser light by the power feedback circuit as pa and that a period of fluctuation of the quantity of state by the phase matching adjustment configuration as pb, a relation pb≥4 pa holds true.

3. The laser device according to claim 1, further comprising a shift mechanism that shifts an incident position of the laser light input to the wavelength conversion optical element, wherein
   when the incident position of the laser light is shifted by the shift mechanism, the phase matching control circuit instructs the phase matching adjustment configuration to adjust the quantity of state.

4. The laser device according to claim 1, wherein:
   the quantity of state is a temperature of the wavelength conversion optical element; and
   the phase matching adjustment configuration is a temperature adjustment device that adjusts the temperature of the wavelength conversion optical element.

5. The laser device according to claim 4, wherein a phase matching state at the wavelength conversion optical element is non-critical phase matching.

6. The laser device according to claim 1, wherein:
   the quantity of state is an incident angle of the laser light input to the wavelength conversion optical element; and
   the phase matching adjustment configuration is an angle adjustment device that adjusts the incident angle.

7. An exposure device comprising:
   the laser device according to claim 1;
   a mask supporting unit that holds a photomask on which a predetermined exposure pattern is formed;
   an exposure object supporting unit that holds an exposure object;
   an illumination optical system that illuminates the photomask held by the mask support unit with the laser light output from the laser device; and
   a projection optical system that projects a light transmitted through the photomask to the exposure object held by the exposure object supporting unit.

8. An inspection device comprising:
   the laser device according to claim 1;
   an inspection object supporting unit that holds an inspection object;
   an illumination optical system that illuminates the inspection object held by the inspection object supporting unit with the laser light output from the laser device; and
   a projection optical system that projects a light from the inspection object to a detector.

9. A laser device comprising:
   a laser light output unit that outputs a fundamental wave laser light;
   a wavelength conversion unit that includes a wavelength conversion optical element, and that performs wavelength conversion of the laser light that inputs into the wavelength conversion optical element and outputs a converted laser light;

an output detection unit that detects a power of the converted laser light output from the wavelength conversion unit;

a power control unit that controls the power of the fundamental wave laser light output from the laser light output unit according to the power of the converted laser light;

a phase matching adjustment unit configured to adjust a quantity of state that relates to phase matching at the wavelength conversion optical element; and a phase matching control unit that controls setting of the quantity of state by the phase matching adjustment unit, wherein in a state in which the power of the converted laser light is controlled by the power control unit, the phase matching control unit instructs the phase matching adjustment unit to adjust the quantity of state such that the power of the fundamental wave laser light output from the laser light output unit is reduced towards a minimal value.

10. The laser device according to claim 9, wherein assuming that a period of a control loop set for a power controlling of the converted laser light by the power control unit as pa and that a period of fluctuation of the quantity of state by the phase matching adjustment unit as pb, a relation pb≥4 pa holds true.

11. The laser device according to claim 9, further comprising a shifting unit that shifts an incident position of the laser light input to the wavelength conversion optical element, wherein when the incident position of the laser light is shifted by the shifting unit, the phase matching control unit instructs the phase matching adjustment unit to adjust the quantity of state.

12. The laser device according to claim 9, wherein:

the quantity of state is a temperature of the wavelength conversion optical element; and the phase matching adjustment unit is a temperature adjustment device that adjusts the temperature of the wavelength conversion optical element.

13. The laser device according to claim 12, wherein a phase matching state at the wavelength conversion optical element is non-critical phase matching.

14. The laser device according to claim 9, wherein:

the quantity of state is an incident angle of the laser light input to the wavelength conversion optical element; and the phase matching adjustment unit is an angle adjustment device that adjusts the incident angle.

15. An exposure device comprising:

the laser device according to claim 9;

a mask supporting unit that holds a photomask on which a predetermined exposure pattern is formed;

an exposure object supporting unit that holds an exposure object;

an illumination optical system that illuminates the photomask held by the mask support unit with the laser light output from the laser device; and a projection optical system that projects a light transmitted through the photomask to the exposure object held by the exposure object supporting unit.

16. An inspection device comprising:

the laser device according to claim 9;

an inspection object supporting unit that holds an inspection object;

an illumination optical system that illuminates the inspection object held by the inspection object supporting unit with the laser light output from the laser device; and a projection optical system that projects a light from the inspection object to a detector.

* * * * *